United States Patent
Pfletschinger et al.

(10) Patent No.: US 11,888,206 B2
(45) Date of Patent: Jan. 30, 2024

(54) VEHICLE-BODY ANTENNA MODULE AND METHOD FOR COOLING A VEHICLE-BODY ANTENNA MODULE

(71) Applicant: Hirschmann Car Communication GmbH, Neckartenzlingen (DE)

(72) Inventors: Markus Pfletschinger, Neckartenzlingen (DE); Thomas Adam, Neckartenzlingen (DE); Uwe Daum, Neckartenzlingen (DE); Dominik Schaich, Neckartenzlingen (DE); Roland Boehmert, Neckartenzlingen (DE)

(73) Assignee: Hirschmann Car Communication GmbH, Neckartenzlingen (DE)

( * ) Notice: Subject to any disclaimer, the term of this patent is extended or adjusted under 35 U.S.C. 154(b) by 0 days.

(21) Appl. No.: 17/469,991

(22) Filed: Sep. 9, 2021

(65) Prior Publication Data
US 2022/0077561 A1    Mar. 10, 2022

(30) Foreign Application Priority Data
Sep. 9, 2020 (DE) .......................... 102020123549.6

(51) Int. Cl.
*H01Q 1/32* (2006.01)
*H01Q 1/02* (2006.01)

(52) U.S. Cl.
CPC ............... *H01Q 1/02* (2013.01); *H01Q 1/325* (2013.01)

(58) Field of Classification Search
CPC ........ H01Q 1/02; H01Q 1/325; H01Q 1/3275; H01Q 1/3291
See application file for complete search history.

(56) References Cited

U.S. PATENT DOCUMENTS

| | | | | |
|---|---|---|---|---|
| 6,094,919 A | * | 8/2000 | Bhatia | H01L 23/38 62/3.2 |
| 10,044,418 B2 | | 8/2018 | Fikar et al. | |
| 10,135,110 B2 | | 11/2018 | Lei et al. | |
| 2008/0192445 A1 | * | 8/2008 | Meyer | H05K 7/20863 361/748 |
| 2017/0170542 A1 | * | 6/2017 | Lei | G08B 25/016 |
| 2021/0254900 A1 | * | 8/2021 | Pozdal | H05K 7/20209 |

FOREIGN PATENT DOCUMENTS

| | | | |
|---|---|---|---|
| DE | 101 60 935 A1 | 7/2003 | |
| DE | 10 2010 064 343 A1 | 7/2012 | |
| DE | 10 2014 002 169 A1 | 8/2015 | |
| DE | 10 2016 123 868 A1 | 6/2017 | |
| EP | 2840647 A1 | 8/2013 | |
| EP | 2840647 A1 * | 2/2015 | ............... H01Q 1/02 |

(Continued)

OTHER PUBLICATIONS

Office Action, dated Apr. 22, 2021, 6 pages.
(Continued)

*Primary Examiner* — Awat M Salih
(74) *Attorney, Agent, or Firm* — Barley Snyder (57) ABSTRACT

A antenna module includes a telematics unit having a telematics printed circuit board and a Peltier element. The telematics printed circuit board has a first section and a second section. The first section is cooled by a forced airflow and the second section is cooled by the Peltier element.

18 Claims, 5 Drawing Sheets

(56) References Cited

FOREIGN PATENT DOCUMENTS

| | | |
|---|---|---|
| JP | 2017510095 B2 | 4/2017 |
| WO | 2010/018 934 A2 | 2/2010 |
| WO | 2021168073 A1 | 8/2021 |

OTHER PUBLICATIONS

Extended European Search Report, Application No. 211195585.1-1203, dated Feb. 10, 2022, 15 pages.
Japanese Office Action with English translation, Application No. 2021-144405, dated Oct. 4, 2022, 16 pages.
Summary of an Office Action from the Intellectual Property Office of Korea dated Jan. 19, 2023, corresponding to Application No. 10-2021-0119175, 2 pages.

* cited by examiner

VEHICLE-BODY ANTENNA MODULE AND METHOD FOR COOLING A VEHICLE-BODY ANTENNA MODULE

CROSS-REFERENCE TO RELATED APPLICATIONS

This application claims the benefit of the filing date under 35 U.S.C. § 119(a)-(d) of German Patent Application No. 102020123549.6, filed on Sep. 9, 2020.

FIELD OF THE INVENTION

The present invention relates to an antenna module and, more particularly, to a vehicle-body antenna module.

BACKGROUND

U.S. Pat. No. 10,135,110 discloses an external vehicle body roof antenna module which is mountable on a roof of a vehicle and which has a cooling system. The cooling system comprises a battery and a Peltier cooling element which can be supplied with electrical current by the battery. An antenna and electronics of the antenna module belonging to the antenna are arranged on a cold side of the Peltier cooling element. The antenna is designed to radiate a signal from the electronics or to receive a radiated signal from another communication device.

The automobile industry will equip the new generations of motor vehicles with 5G technology. For the high frequencies thereof, it is expedient to put a NAD (network access device) transceiver close to an antenna module in order to avoid cable losses. External or integrated roof antenna modules demonstrate good high-frequency performance, with the disadvantage of possibly high temperatures when exposed to sunlight, wherein the temperature-sensitive transceivers will be integrated into such hot areas in the future. The temperature below/in a vehicle roof is up to 105° C. The typical operating temperature range of a transceiver is from −40° C. to +85° C. (above +85° C., the SAW filters of the NAD transceiver can usually no longer be used, because they lose their effectiveness or operate outside a specification).

In order for a NAD transceiver of an antenna module to be able to function in a hot environment, active cooling is necessary. Other components such as a power supply, an amplifier, a CPU, an Ethernet device, Wi-Fi, GNSS, SDARS, etc. can operate at higher temperatures (junction temperature) up to 125° C. An additional challenge is that the space available to the entire intelligent antenna module is limited. Here, a thermal short circuit between different critical temperature ranges must be avoided. Thus, it must be possible to manage high temperature differences in a small area.

SUMMARY

A antenna module includes a telematics unit having a telematics printed circuit board and a Peltier element. The telematics printed circuit board has a first section and a second section. The first section is cooled by a forced airflow and the second section is cooled by the Peltier element.

BRIEF DESCRIPTION OF THE DRAWINGS

The invention will now be described by way of example with reference to the accompanying Figures, of which.

DETAILED DESCRIPTION OF THE EMBODIMENT(S)

The present invention will be described below in greater detail with the aid of exemplary embodiments, making reference to the attached schematic drawings, which are not to scale. Sections, elements, parts, units, components, and/or schemes which have an identical, univocal, or analogous configuration and/or function have the same reference signs. A possible alternative which is not described herein, which is not depicted in the drawing, and/or which is not conclusive, a static and/or kinematic reversal, a combination, etc., with respect to the exemplary embodiments of the present invention or a component, a diagram, a unit, a part, an element, or a section thereof, may furthermore be removed from the list of reference signs and/or the description of the figures.

In the present invention, a feature (section, element, part, unit, component, function, dimension, etc.) may be designed positively, i.e. being present, or negatively, i.e. being absent. In this specification, a negative feature is not explicitly described as a feature unless, according to the present invention, importance is placed on it being absent. That is, the invention which is actually made, and not an invention which is constructed by the prior art, is to omit this feature.

A feature of this specification may be used not only in a specified way, but also in another way and/or manner (isolation, summary, replacement, addition, unique position, omission, etc.). In particular, on the basis of a reference sign and a feature associated with it, or vice versa, it is possible to replace, add, or omit a feature in the patent claims and/or the description in the description, the patent claims, and/or the drawing. In addition, a feature in a patent claim may thereby be interpreted and/or specified in greater detail.

The features of the description may be interpreted as optional features (in the view of the (initially mostly unknown) prior art), i.e. each feature may be comprehended as a non-binding feature. Thus, an extraction of a feature, possibly including its periphery, from an exemplary embodiment is possible, wherein this feature is then transferable to a generalized inventive idea. The absence of a feature (negative feature) in an exemplary embodiment indicates that the feature is optional with respect to the present invention. Furthermore, in the case of a species term for a feature, a generic term may also be read for the feature (possibly further hierarchical breakdown into subgenus, etc.), whereby, for example, a generalization of the feature is possible, taking equal effect and/or equivalence into consideration.

The present invention is explained below with the aid of exemplary embodiments of an embodiment of a variant of a vehicle-body antenna module 10, in particular a 5G antenna module 10, in connection with a method for cooling such an antenna module 10, for a vehicle, in particular a motor vehicle. Although the present invention is described and illustrated in greater detail through embodiments, the present invention is not limited by the disclosed exemplary embodiments, but is of a more fundamental nature.

Other variations may be derived from description without departing from the protective scope of the present invention. The present invention is generally applicable in the field of vehicle antennas, in particular in external or integrated roof antenna modules for motor vehicles. The drawing depicts only the spatial sections of an object of the present invention which are necessary for understanding the present invention.

Figure 1:
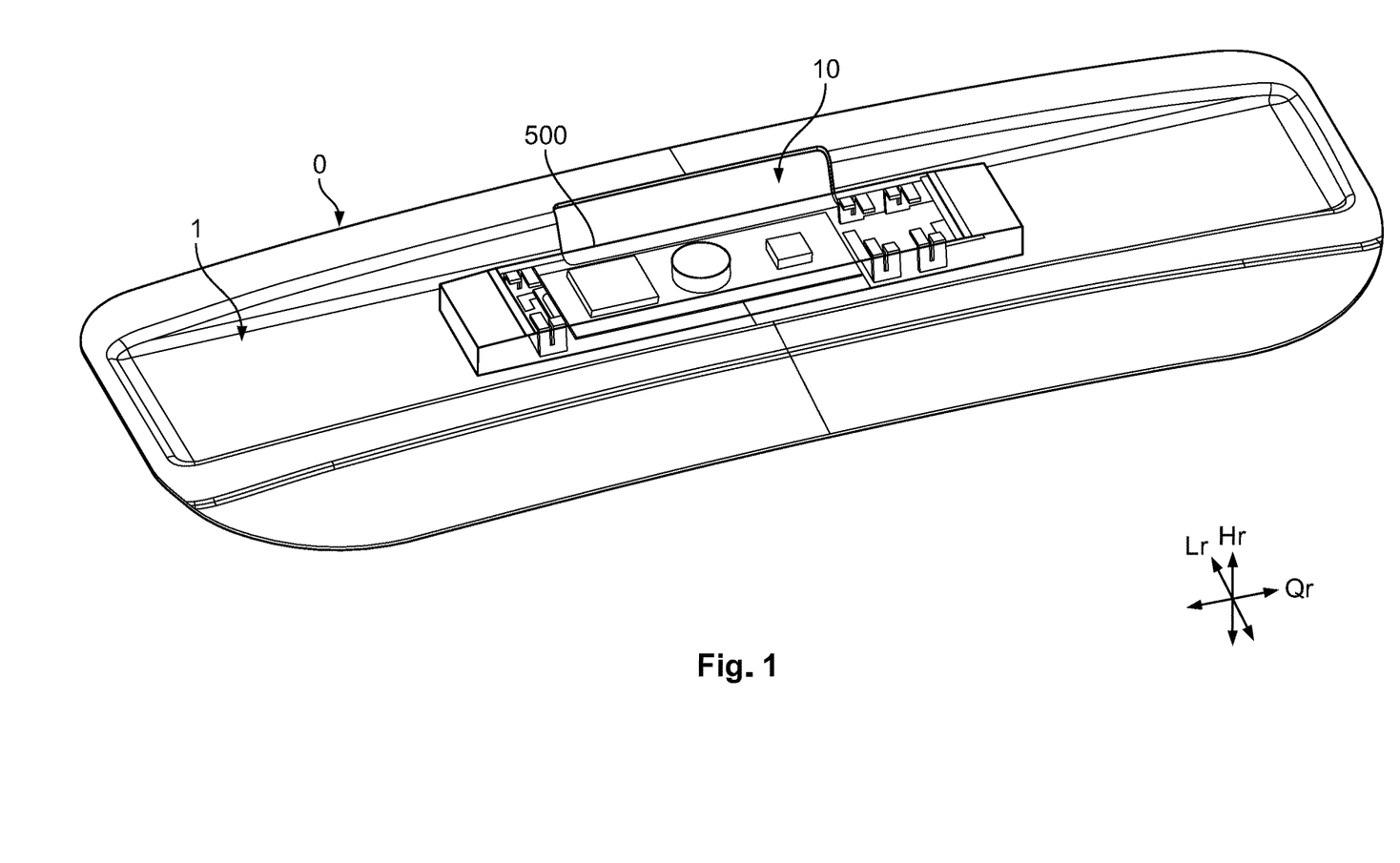
FIG. 1 is a perspective view of an antenna module according to an embodiment.
Figure 2:
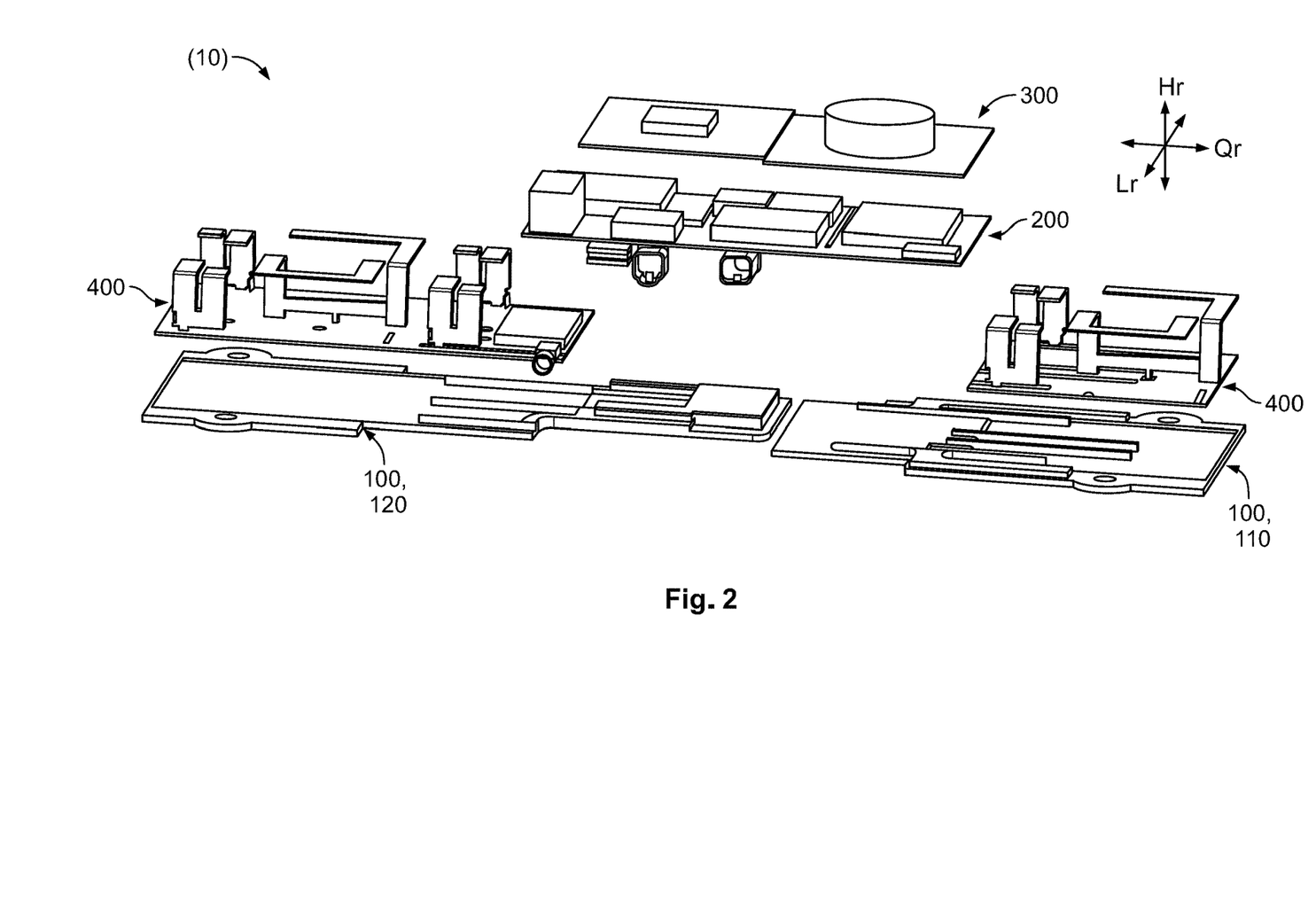
FIG. 2 is an exploded perspective view of an embodiment of the antenna module.

FIGS. 1 and 2 depict two general structures of integrated antenna modules 10, wherein, in FIG. 1, the antenna module 10 is arranged in a recess 1, in particular a depression 1, of a vehicle body 0, in particular of a rear end 0 or a roof 0 (front, center, rear). Very generally approximately, the antenna module 10 has the shape of a prismatoid, in particular approximately or essentially the shape of a cuboid, having a comparatively long transverse extension (in the transverse direction Qr of the vehicle or antenna module 10), and a length (in the longitudinal direction Lr of the vehicle or antenna module 10) which is greater than its height (in the vertical direction Hr of the vehicle or antenna module 10). In an embodiment, the antenna module 10 is a 5G antenna module.

The antenna module 10 may be an external and/or integrated vehicle-body antenna module 10 for a vehicle, such as a motor vehicle. The term 'vehicle-body antenna module' is intended to express that the antenna module 10 is configured for attachment and/or installation on and/or in a section of a vehicle body, in particular at least one vehicle body 0 part, a rear vehicle body, at least one rear body part, a (rear) vehicle roof, etc., of a vehicle, in particular a motor vehicle. Here, the antenna module 10 may be configured as an external antenna module (i.e. mountable externally on the vehicle body 0) and/or in particular as an integrated antenna module (i.e. mountable internally in/on the vehicle body 0, for example, beneath an outer skin, a cover, etc.). Of course, a hybrid form thereof may be used.

Such an antenna module 10 depicted in FIGS. 1 and 2 comprises, for example, a lower housing 100, a telematics unit 200 (TCU: telematics control unit), possibly another circuit board 300, for example, an antenna support 300, in particular for satellite services, possibly at least one antenna support 400, and an upper housing 500. In the event that the other printed circuit board 300 is provided, it is mounted in the upper housing 500 in an embodiment.

According to the present invention, see FIGS. 3 to 6, the telematics unit 200 comprises a telematics printed circuit board 202, in addition to a cooling device 222, 223, 226, 228. The telematics printed circuit board 202 (see in particular FIG. 6) is divided into two sections 214, 224, wherein the first section 214 is configured as a non-NAD (network access device) area 214, and the second section 224 is configured as a NAD area 224. In an embodiment, an outer shape, i.e. an outer contour of an actual printed circuit board of the telematics printed circuit board 202, is formed at least in sections mirror-symmetrically with respect to a central transverse axis Qr of the telematics printed circuit board 202. In particular, the non-NAD area 214 and/or the NAD area 224 is mirror-symmetric in this manner.

The NAD area 224 of the telematics printed circuit board 202 is the area in which the NAD (network access device) and possibly its peripherals (see FIG. 6) are arranged. In particular, this may be a specific end section of the telematics printed circuit board 202. Accordingly, the non-NAD area 214 is the area of the telematics printed circuit board 202 which is away from the NAD and possibly its peripherals. Furthermore, alternatively or in addition, the NAD area 224 may be configured and/or designated as a thermally critical area, and the non-NAD area 214 may be configured and/or designated as a thermally less critical area, of the telematics printed circuit board 202.

Figure 3:
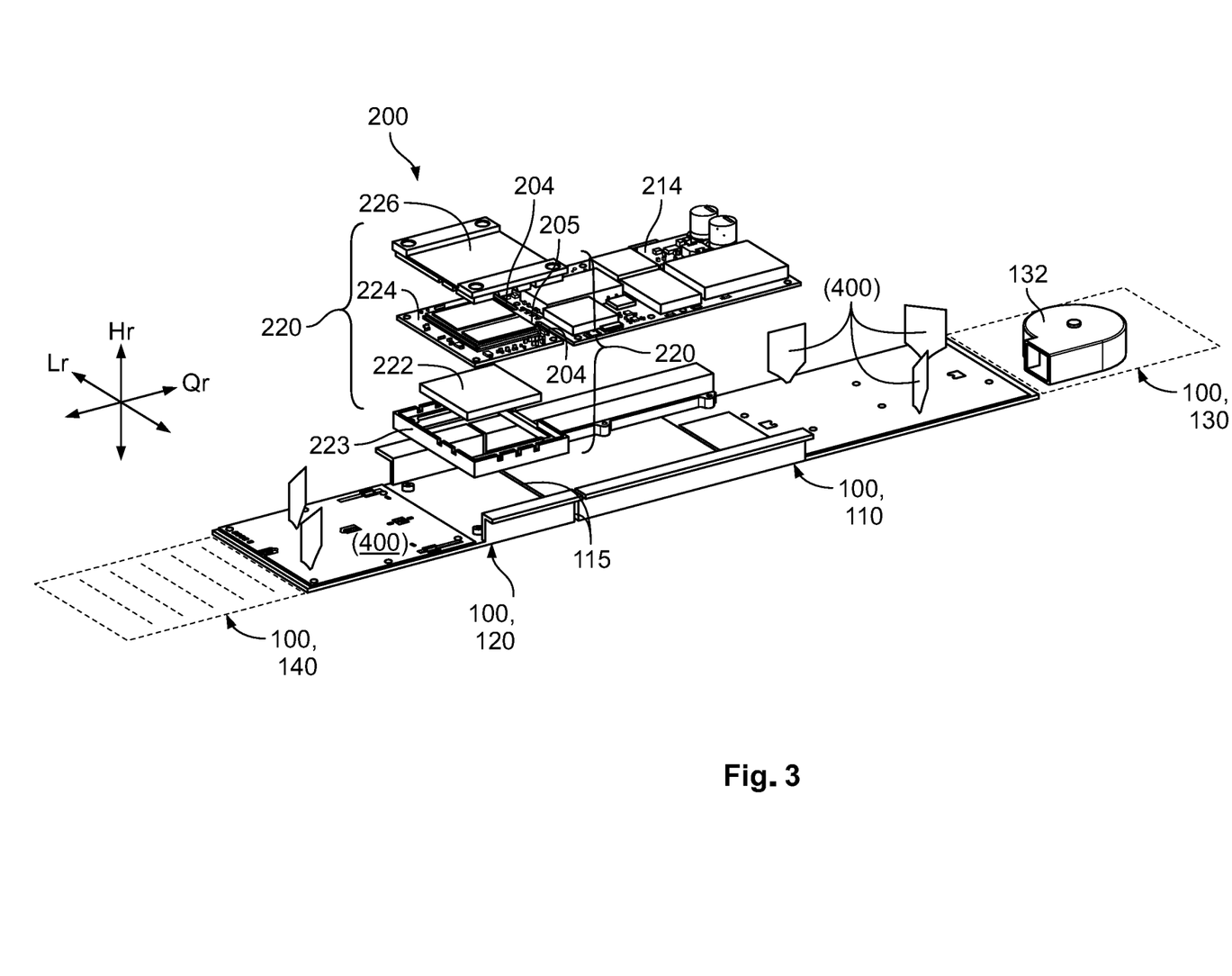
FIG. 3 is an exploded perspective view of an arrangement of a lower housing and a telematics unit of an embodiment of the antenna module.
Figure 4:
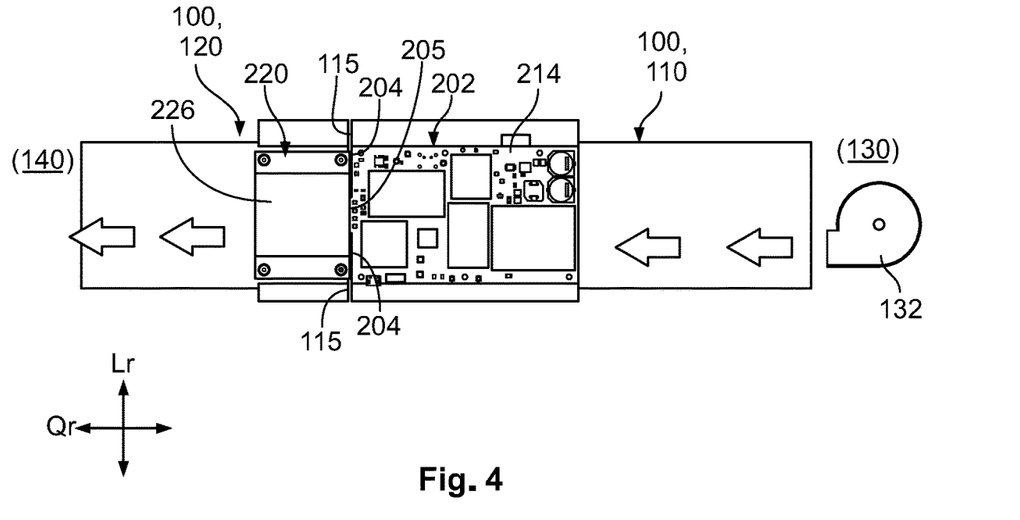
FIG. 4 is a plan view of the arrangement of the lower housing and the telematics unit of FIG. 3 in an assembled state.
Figure 6:
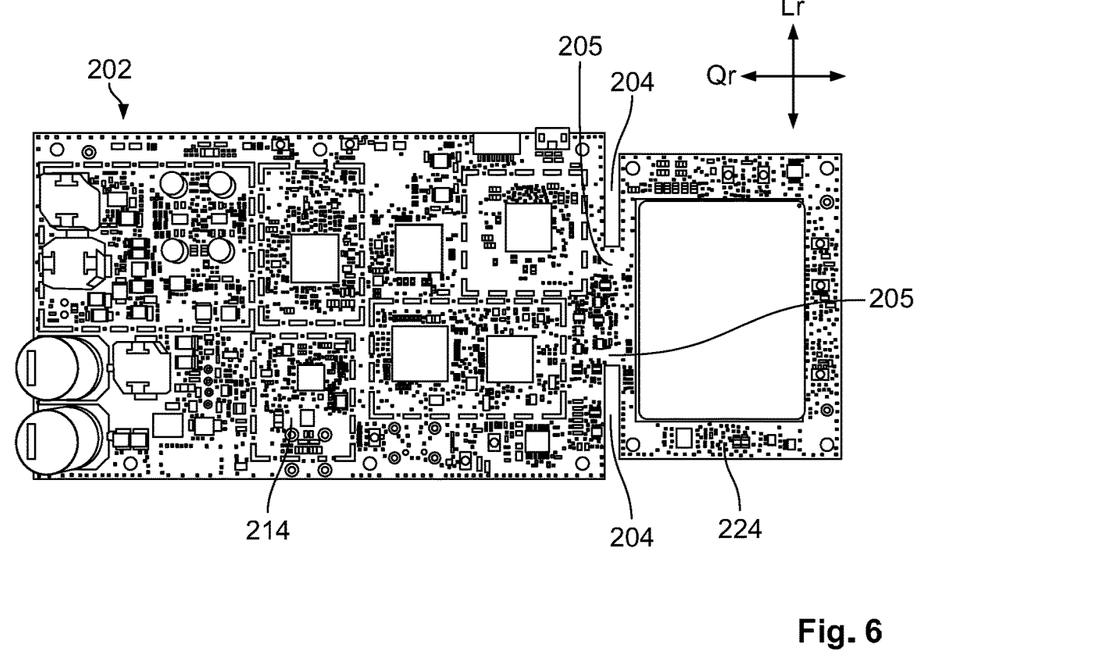
FIG. 6 is a plan view of a telematics printed circuit board according to an embodiment.

The telematics printed circuit board 202 comprises a thermal barrier arrangement 204, for example, at least one through-slit 204, between the non-NAD area 214 and the NAD area 224, as shown in FIGS. 3, 4, and 6. The thermal barrier arrangement 204 decouples a mutual heat exchange. The thermal barrier arrangement 204 is intended, in particular, to prevent a heat influx from the non-NAD area 214 into the NAD area 224 of the telematics printed circuit board 202. The thermal barrier arrangement 204 may be arranged, for example, as a through-slit, a reduced cross-section, a reduction of a ground conductor, a local reduction of an occurrence of a metal, in particular copper, etc., in the telematics printed circuit board 202.

In the shown embodiment, the thermal barrier arrangement 204 comprises two through-slits 204, 204, which mirror-symmetrically divide the telematics printed circuit board 202 into a head 224, neck 205, and torso 214 (FIG. 6), with respect to the central transverse axis Qr. The remaining neck 205, being a constriction, is designed in such a way that a signal exchange between the head 224 and the torso 214 is ensured, but any other (heat-conducting) material between the head 224 and the torso 214 is primarily or essentially removed. The head 224 is comparatively small with respect to the torso 214 and the neck 205 is a narrow point between the head 224 and the torso 214.

A transceiver module for mobile communication (NAD), in an embodiment, is situated on an upper side of the telematics printed circuit board 202 (see FIG. 3). There are several technical reasons for this. The transceivers themselves are supplied as separate modules which comprise a printed circuit board, ICs soldered onto it, and a protective cage. The best heat dissipation is achieved via the printed circuit board of the module (lowest thermal resistance), i.e. the telematics printed circuit board 202. Heat dissipation via the protective cage is often significantly less effective. The best connection of a heat exchanger, i.e. the Peltier element 222, is therefore through the path of the telematics printed circuit board 202, which carries the transceiver module and other electronic components.

According to the present invention (see FIGS. 3 to 5), if a limit temperature is exceeded at/in the antenna module 10, the first section 214 of the telematics printed circuit board 202 or the non-NAD area 214, and the second section 224 of the telematics printed circuit board 202 or the NAD area 224, are actively cooled, wherein the first section 214 or the non-NAD area 214, and the second section 224 or the NAD area 224, can be cooled essentially independently of one another.

In an embodiment, the first section 214 of the telematics printed circuit board 202 or the non-NAD area 214 is cooled by a forced airflow, and the second section 224 of the telematics printed circuit board 202 or the NAD area 224 is cooled by a Peltier element 222 (TEC (thermoelectric cooler) element 222). The forced airflow may be generated by a fan 132, a centrifugal fan 132 in an embodiment. The fan 132 may blow or suck the forced airflow across the telematics printed circuit board 202, possibly also laterally and/or past the bottom, or through the antenna module 10. In addition or alternatively, the antenna module 10 is also fluid-mechanically connectable to an air conditioning system of the vehicle.

For the temperature control, for example, of thermal management by, for example, of thermal software, see below.

Furthermore, the telematics unit 200 may be divided into two areas 214, 224 adjoining each other in the transverse direction Qr. The first area 214 is essentially identical to the first section 214 of the telematics printed circuit board 202 or the non-NAD area 214. The second area 224 of the telematics unit 200 comprises a cooling package 220 in which the NAD area 224 of the telematics printed circuit board 202 is arranged to be coolable. The orientations of the two areas 214, 224 i.e. an extent of the first area 214 (in the transverse direction Qr) and a stacking direction (sandwich) of the second area 224 (in the vertical direction Hr), are primarily or essentially perpendicular to one another in an embodiment.

In addition, at least one area or both areas 214, 224 of the telematics unit 200 may be in heat-transfer contact with the lower housing 100. For this purpose, the heat-transfer device 102 described below, for example, a thermally conductive pad, a thermally conductive paste, thermally conductive gel, etc., may be arranged between the lower housing 100 and the corresponding area 214, 224.

In addition, the airflow which is forceable by the fan 132 may be directed onto the cooling package 220.

With reference to FIG. 3 from bottom to top, the cooling package 220 comprises an accommodation frame 223 in which the Peltier element 222 may be accommodated. Furthermore, the NAD area 224 may be accommodated on the Peltier element 222 in the accommodation frame 223, wherein they are in good heat-transfer contact. The cooling package 220 is closable at the top, in an embodiment, by a cooling package cover 226 which may be situated on the NAD area 224 or may be arranged at a distance (air gap) therefrom. The cooling package cover 226 may be made of a metal, in particular aluminum, and/or a plastic. The accommodation frame 223 may be made of metal, in particular aluminum, or plastic.

The first area 214 or the non-NAD area 214 is arranged in good heat-transfer contact on the lower housing 100, in particular a first (lower housing) base plate 110. The second area 224 or the NAD area 224 or the cooling package 220 or the Peltier element 222 and possibly the accommodation frame 223 is arranged in good heat-transfer contact on the lower housing 100, in particular a second (lower housing) base plate 120. The lower housing 100 may comprise at least or exactly two bottom plates 110, 120. The first base plate 110 may be in heat-transfer contact with the non-NAD area 214. Furthermore, the second base plate 120 may be in heat-transfer contact with the cooling package 220, in particular a hot side of the Peltier element 222. The respective heat-transfer contact may be configured by a heat-transfer device, for example, a thermally conductive pad, a thermally conductive paste, a thermally conductive gel, etc., (this also applies analogously to the above single base plate). In an embodiment, the bottom plates 110, 120 are fabricated from a metal, in particular aluminum, (this again applies analogously to the above single base plate). The hot side of the Peltier element 222 of course depends on a current flow through the Peltier element 222, i.e. the Peltier element 222 is to be actuated for cooling in such a way that its hot side is arranged here (single or second base plate).

In an embodiment, the first base plate 110 and the second base plate 120 are arranged spaced with respect to one another in the antenna module 10 via a thermal barrier 115 configured, for example, as an air slit 115. The thermal barrier 115 is intended to prevent a thermal short circuit, i.e. a heat exchange between the base plate sections 110, 120, at least partially or essentially. The thermal barrier 115 is intended, in particular, to prevent heat influx from the first section 110 into the second section 120 of the base plate. The thermal barrier 115 may be configured, for example, as a through-slit, a reduced cross section, etc., in the base plate. Furthermore, the two sections may be connected to one another via a thermal insulator, to form one, or a single, base plate 110, 120.

In an embodiment, the thermal barrier arrangement 204 of the telematics printed circuit board 202 and the thermal barrier slit 115 between the two base plates 110, 120 at least overlap when viewed in the transverse direction Qr, or that the one is inside the other or they essentially align with one another when viewed in the vertical direction Hr.

The Peltier element 222 is arranged in the cooling package 220 in such a way, or is actuated for cooling the second area 224 or the NAD area 224 in such a way, that the hot side thereof is situated at the second base plate 120, and the cold side thereof is situated at the NAD area 224. In particular, good heat-transfer contact is established in each case.

The NAD area 224 may be in heat-transfer contact with a cold side of the Peltier element 222. Of course, the cold side of the Peltier element 222 depends on a current flow through the Peltier element 222, i.e. the Peltier element 222 is to be actuated for cooling in such a way that its cold side is established here (NAD area 224). If the NAD area 224 is to be heated, for example, in the case of very cold outside temperatures, this is of course possible by reversing the current flow.

Figure 5:
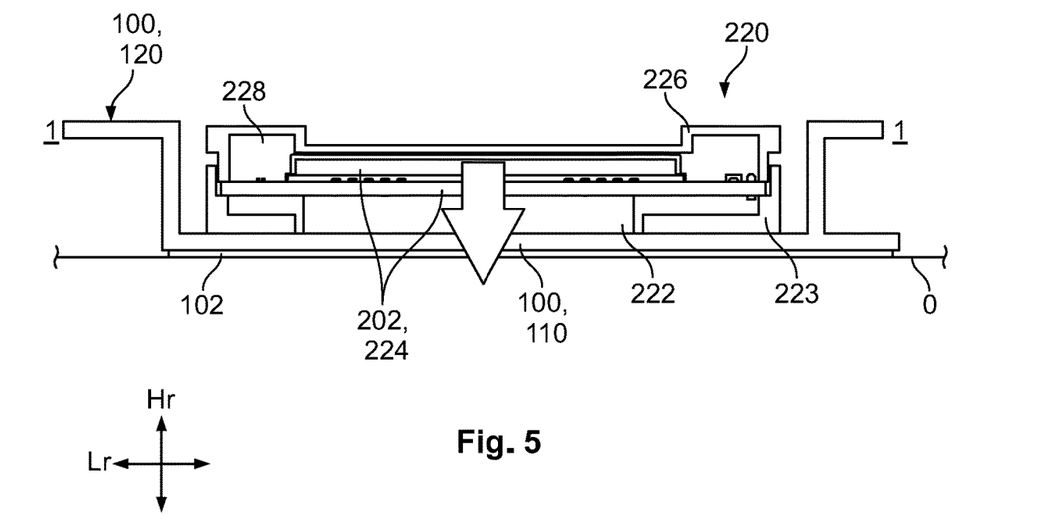
FIG. 5 is a sectional side view of the arrangement of the lower housing and the telematics unit of FIG. 4 in a recess of a vehicle body of a motor vehicle.

At least beneath the second base plate 120, in particular beneath both bottom plates 110, 120, i.e. on outer surface of the antenna module 10, a heat-transfer device 102, for example, a thermally conductive pad 102, is arranged, as shown in FIG. 5, which may be provided on the vehicle body 0 and, for example, in the recess 1, for establishing good heat-transfer contact. In other embodiments, the heat-transfer device 102 may be a thermally conductive paste, a thermally conductive gel, a solder, etc.

The antenna module 10 is configured in such a way that the vehicle body 0 of the vehicle or the vehicle functions as a substantial heat sink. 'Substantial heat sink' is intended to be understood to be the only intended heat sink, apart from forced heat transport by a fan 132 (as described herein) and other dissipation by the antenna module 10. The antenna module 10 may be configured in such a way that heat from the telematics unit 200 can be transferred to the/a vehicle body 0 via the lower housing 100. The lower housing 100 is fabricated, in an embodiment, from a good heat conductor, in particular from metal, such as aluminum.

The cooling package 220 may have a sandwich structure, in which the package components thereof are arranged stacked in the vertical direction of the antenna module 10. Furthermore, the airflow which is forceable by the fan 132 may be further directed to the cooling package 220 of the telematics unit 200. The airflow is to flow past the cooling package 220, in particular below it and/or at the side.

The Peltier element 222 or the cold side of the Peltier element 222, the accommodation frame 223, and the cooling package cover 226 define a more or less sealed cooling space 228, depending on the design effort carried out for the sections involved, including the telematics printed circuit board 202 in the area of its narrow point 202. Here, the NAD area 224 is situated inside, and the non-NAD area 214 is situated outside, the cooling space 228 of the cooling package 220 of the telematics unit 200.

The cooling package 220 may be configured as a kind of 'refrigerator' or cooling box (see also FIG. 5). The Peltier element 222 forms the rear wall of the refrigerator having a warm outer surface (this heat is essentially transferred to the vehicle body 0 via the lower housing 100 (second base plate 120) and a cooling inner side (cooling space) during the operation of the Peltier element 222. The accommodation frame 223, possibly together with a frame of the cooling package cover 226, forms a circumferential outer wall of the refrigerator, wherein furthermore, the cooling package cover 226 functions as a closed refrigerator door, and closes off a cooling space of the refrigerator opposite to the cooling inner side of the Peltier element 222. By this measure, the NAD of the NAD area 214, or the NAD area, is thermally insulated and decoupled from the forced airflow. The cooling package 220 does not have to be either liquid-tight or gas-tight.

An antenna support 400 may be provided on the first base plate 110 and/or the second base plate 120, as shown in FIG. 3. By an internal arrangement of the components of the antenna module 10, for example, with at least one separate antenna support 400, flexibility is provided, and it is possible to adjust a single antenna support 400 quickly to a changing requirement (installation space, extended frequency range, etc.), without necessarily having to modify the telematics printed circuit board 202 or another antenna support 10, for example, an antenna printed circuit board. In an embodiment, the antenna supports 400 utilize a maximum available height of the antenna module 10 in order to achieve a highest possible efficiency. That is, apart from an upper housing 500 and possibly a base plate 110 and/or possibly a lower housing 100, the antenna support 400 takes up essentially the full height in at least one area inside the antenna module 10.

The forceable airflow may be directed onto this at least one antenna support 400. Adjacent, in a respective transverse direction Qr, a respective (lower housing) side end portion 130, 140 may connect to one or both bottom plates 110, 120. The fan 132 may be mounted, for example, on an air intake of the side end portion 130. Furthermore, the other side end portion 140 may comprise an air outlet for transporting heated air out of the antenna module 10. In an embodiment, the side end portions 130, 140 are 2 formed from a plastic.

In one embodiment, cooling air may be directed by the fan 132 from one transverse end section to the other transverse end section of the antenna module 10 in which the air outlet is located, as a function of a geometry of the antenna module 10. The lateral arrangement of the fan 132, i.e. in the transverse direction Qr outside, is conducive to achieving a low height of the antenna module 10. Furthermore, the fan 132 helps other integrated electronics, for example, on an antenna support 400, for example, an antenna printed circuit board, another printed circuit board (see below), etc., to be coolable via the cooling air. This may also apply to a certain extent to the hot side of the Peltier element 222, wherein the cooling air is able to flow laterally past the cooling package 220 in the transverse direction Qr. For this purpose, an air gap may be arranged in the transverse direction between the cooling package 220 and, for example, a side wall or a parapet of the second base plate, a housing section of the antenna module, etc.

The lower housing 100 may be configured in such a way that it is connectable to the vehicle body 0 in an areal manner. Thermal coupling surfaces which relate to one another should be as large as possible, wherein a surface pressure can be set between these two coupling surfaces in order to achieve good thermal contact. This may be achieved, for example, by a screw connection. For example, a thermally conductive pad, a thermally conductive paste, a thermally conductive gel, etc. may then also be used. The lower housing 100 may further comprise a heat transfer device, in particular a thermally conductive pad, on its outer surface. A thermally conductive paste, a thermally conductive gel, etc. may possibly also be used. As a result, the heat arising in the antenna module 10 may be dissipated well to the vehicle body 0 and thus the entire vehicle. This heat may then also be dissipated by the vehicle body 0 or the vehicle to the environment, which, in turn, acts as a heat sink.

The antenna module 10 itself is free of a separate heat sink in an embodiment, in particular a separate finned heat sink, i.e. the antenna module 10 does not comprise such a heat sink. Of course, for example, the lower housing 100 or at least a base plate 110, 120 may additionally be configured as a cooler, for example, by cooling fins. In particular, a side wall or a parapet, in a transverse direction, is suitable for this purpose. In an embodiment, the cooler or the cooling fins are also coolable by the forced airflow. As a result, furthermore, the air coming from the fan 132 may be better directed, and the heat of the Peltier element 222 may be better transferred.

The telematics unit 200, in an embodiment, comprises not only a transceiver (transceiver module), but in an embodiment further components, for example, WLAN/BT/BTLE, a receiver for GNSS, Gyro, audio amplifier for eCall, CAN transceiver, Ethernet transceiver, and/or at least one microcontroller, etc. Thus, it is a complete telematics unit 200 and not just a transceiver or an IC. In contrast to a transceiver, these additional electronics can handle higher temperatures and do not require sophisticated cooling; a fan is sufficient here.

However, additional electronics must be prevented, to the greatest possible extent, from heating up the transceiver module even further. Otherwise, the Peltier element 222 would be further loaded with heat and would possibly cause a thermal short circuit. Thus, it is necessary to create a kind of island (peninsula) (transceiver module, NAD area 224) having as little connection as possible between these two sections (non-NAD area 214 and transceiver module or NAD area 224). Here, it may be necessary to insulate the transceiver thermally in the cooling package 220. By a lateral arrangement of the fan 132, the air is able to cool the electronics, and simultaneously cools the cooling package 220. Thus, there is a combination of two different sections or areas to be cooled in one cooling concept.

In principle, a transceiver usually works ideally only in a certain defined temperature range. By cooling and possibly heating, according to the present invention, it is attempted to be able to operate the transceiver in this range for as long as possible. But if a temperature rises still further, it is not just performance alone which is important, but rather, basic functionality must still be provided, in order, for example, to be able to trigger an eCall in the case of emergency. In such a case, eCall capability must be ensured. Accordingly, the antenna module 10 is to be actuated or partially switched on in order not to create even more heat.

Figure 7:
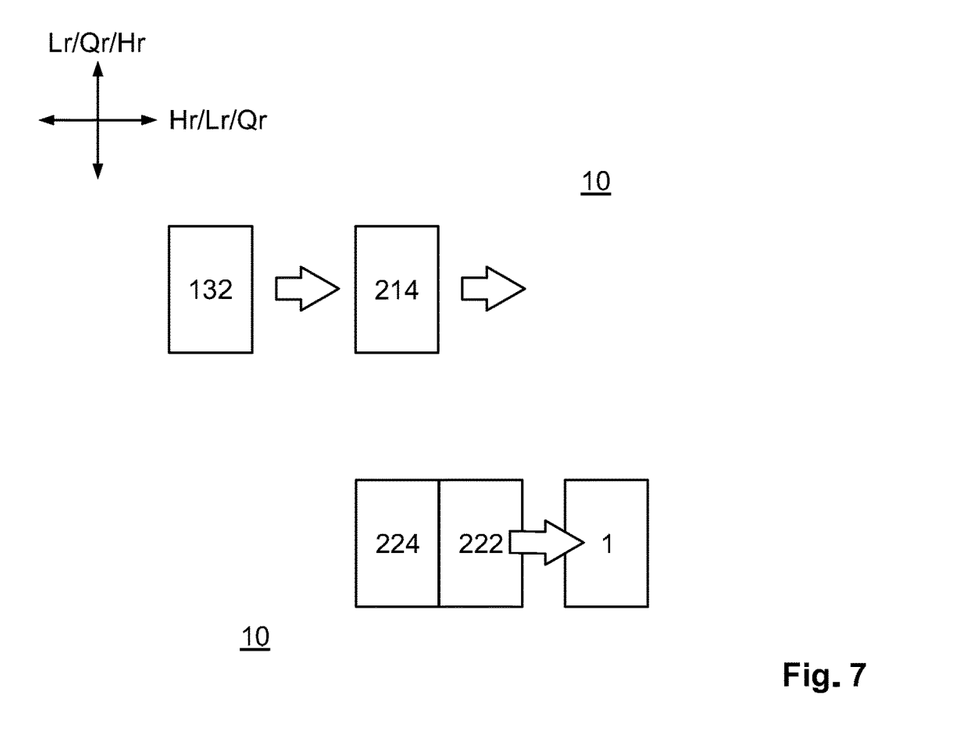
FIG. 7 is a block diagram of a principle of a cooling system for the antenna module.

Of course, according to the present invention, it is possible to push the isolation so far that the non-NAD area 214 and the transceiver module or the NAD area 224 are arranged separately from one another in the antenna module 10. This is depicted in the schematic block diagram in FIG. 7 (no intrinsic connection between the non-NAD area 214 and the NAD area 224). The arrows at the top indicate an airflow from the fan 132 across the non-NAD area 214, and the arrow at the bottom indicates a heat flow from the Peltier element 222 into the vehicle body 1.

The antenna module 10 may comprise another printed circuit board between the lower housing 100, in particular the telematics unit 200, and the upper housing 500. The other printed circuit board may be mounted, for example, in the upper housing 500. A maximum or achievable height of the antenna module is: approximately: 50 mm, 45 mm, 40 mm, 35 mm, 32.5 mm, 30 mm, 27.5 mm, 25 mm, 22.5 mm, 20 mm, 17.5 mm, or 15 mm.

By the antenna module 10, a method according to the present invention for cooling a vehicle-body antenna module, in particular a 5G antenna module, may be carried out.

In the method according to the present invention for cooling, if a limit temperature is exceeded, the non-NAD area 214 and/or the NAD area 224 are actively cooled, and the non-NAD area 214 and the NAD area 224 can be cooled essentially independently of one another. This means, for example, that if a first limit temperature is exceeded, essentially only the NAD area 224 or essentially only the non-NAD area 214 may be actively cooled initially. If a second limit temperature is exceeded, in addition, the non-NAD area 214 or the NAD area 224 may also be actively cooled. Of course, it is possible that if a third limit temperature is exceeded, both the non-NAD area 214 and the NAD area 224 are actively cooled. A corresponding cooling system may remain dormant until the corresponding limit temperature in the antenna module 10 or in an electronic system of the antenna module has been reached.

Here, for example, a maximum temperature of the NAD area 224 is 85° C. during operation of the antenna module, so that, for example, a limit temperature therefor may be set to approximately: 75° C., 77.5° C., 80° C., 81° C., or 82° C. A maximum temperature for the non-operation of the NAD area 224 may be higher, approximately 105° C. to 125° C. Correspondingly, a limit temperature is to be selected therefor. Furthermore, for example, a maximum temperature of the non-NAD area 214 is 125° C. during operation of the antenna module 10, so that, for example, a limit temperature therefor may be set to approximately: 115° C., 117.5° C., 120° C., 121° C., or 122° C.

If a limit temperature is exceeded, the non-NAD area 214 may be cooled by a forced airflow from the fan 132. If a limit temperature is exceeded, the NAD area 224 may be cooled by the Peltier element 222. If a limit temperature is exceeded, the NAD area 224 may be cooled by the/a Peltier element 222 and the/a forced airflow.

In embodiments, heat of the non-NAD area 214 may be transported out of the vehicle-body antenna module 10 by the forced airflow (see arrows (airflow) in FIG. 3) in the transverse direction Qr. Furthermore, heat of the Peltier element 222 may be transported out of the vehicle-body antenna module 10 by the forced airflow in the transverse direction Qr. This heat flow is relatively small in comparison to the heat flow of the Peltier element 222 which may be dissipated to the vehicle body 0 (see arrow (heat flow) in FIG. 5). In addition, heat of the Peltier element 222 may be dissipated to a body 0 of the vehicle, via a lower housing 100 or a base plate 110, 120 of the vehicle-body antenna module 10 as described above. This heat flow is relatively large in comparison to the heat flow of the Peltier element 222, which may be transported away by the forced airflow.

In an embodiment, (intelligent) thermal software controls/regulates the fan 132, the Peltier element 222, and/or the telematics printed circuit board 202, in order to avoid thermal failures and/or damage to the electronics. At least one temperature sensor forms a starting point for thermal management by the thermal software. The relevant limit temperature may be measured at/in at least one critical electronic component, in particular the telematics printed circuit board 202. Furthermore, the relevant limit temperature may be measured outside on and/or inside in the non-NAD area 214, and/or outside on and/or inside in the NAD area 224. Furthermore, the relevant limit temperature may be measured at at least one point on the/a base plate 110, 120, in the vicinity of the Peltier element 222.

In an overall concept, for example, thermal management may be used, by which the following possible scenarios may be applied, as a function of a single limit temperature or several limit temperatures, possibly taking the outside temperature into consideration.

Scenario a: the fan 132 is inactive and the Peltier element 222 is inactive; scenario b: the fan 132 is active (with control/regulation of the airflow or the cooling) and the Peltier element 222 is inactive; scenario c: the fan 132 is active (with/without control/regulation of the airflow or the cooling) and the Peltier element 222 is active (with/without control/regulation of the power); and/or scenario d: the fan 132 is inactive and the Peltier element 222 is active (with/without control/regulation of the power).

In the cooling method, if a limit temperature is exceeded inside the antenna module 10, possibly even in the case of active cooling, at least one affected component of the antenna module 10 may not be operated. The antenna module 10 may be configured as a vehicle-body antenna module 10 according to the present invention, in particular a 5G antenna module.

At very low temperatures, for example, below −25° C. to below −35° C., in particular below −40° C., the following scenario e is still also applicable. Since performance of the NAD area 224 is possibly not ideal or not given at such temperatures, the NAD area 224 may be brought into a better or ideal temperature range via heating. That is, by electrically reversing the polarity of the Peltier element 222, the Peltier element 222 may be used for heating the NAD area 224.

The cooling method may be carried out by means of an internal control unit of the antenna module 10 or possibly a control unit of the vehicle, which, of course, may also assume other tasks.

What is claimed is:
1. An antenna module, comprising:
a telematics unit having a telematics printed circuit board and a Peltier element, the telematics printed circuit board has a first section and a second section, the first section is cooled by a forced airflow and the second section is cooled by the Peltier element, the first section is a non-NAD area and the second section is an NAD area, the telematics printed circuit board has a thermal barrier arrangement between the NAD area and the non-NAD area, the thermal barrier arrangement is at least one through-slit in the telematics printed circuit board narrowing the telematics printed circuit board at a neck.

2. The antenna module of claim 1, further comprising a fan in a transverse end section, the forced airflow is forced by the fan onto the first section.

3. The antenna module of claim 1, wherein the second section has a cooling package in which the NAD area of the telematics printed circuit board is arranged.

4. The antenna module of claim 3, wherein the cooling package includes the Peltier element, the NAD area, and a cooling package cover closing an accommodation frame in which the Peltier element and the NAD area are accommodated.

5. The antenna module of claim 4, wherein the cooling package has a sandwich structure in which component of the cooling package are stacked in a vertical direction of the antenna module, the force airflow is directed into the cooling package.

6. The antenna module of claim 1, further comprising a lower housing in heat-transfer contact with at least one of the first section and the second section.

7. The antenna module of claim 6, wherein the lower housing has a base plate with a first section of the base plate in heat-transfer contact with the non-NAD area of the telematics printed circuit board and a second section of the base plate in heat-transfer contact with a cooling package in which the NAD area of the telematics printed circuit board is arranged, the base plate has a thermal barrier between the first section of the base plate and the second section of the base plate.

8. The antenna module of claim 6, wherein the lower housing has a first base plate in heat-transfer contact with the non-NAD area of the telematics printed circuit board and a second base plate in heat-transfer contact with a cooling package in which the NAD area of the telematics printed circuit board is arranged, the first base plate and the second base plate are spaced apart from one another via a thermal barrier.

9. The antenna module of claim 8, further comprising an antenna support arranged on the first base plate or the second base plate, the force airflow is directed onto the antenna support.

10. The antenna module of claim 9, wherein the lower housing has a first side end portion in a transverse end section on which a fan creating the forced airflow is mounted and a second side end portion in a transverse end section having an air outlet.

11. The antenna module of claim 6, wherein the lower housing has a heat-transfer device on an outer surface.

12. The antenna module of claim 1, wherein the second section is in heat-transfer contact with a cold side of the Peltier element.

13. The antenna module of claim 1, wherein the antenna module does not have a separate heat sink.

14. A vehicle, comprising:
a vehicle body; and
an antenna module according to claim 1 mounted to the vehicle body.

15. A method for cooling an antenna module, comprising:
providing the antenna module with a telematics unit including a telematics printed circuit board, the telematics unit or the telematics printed circuit board has a non-NAD area and an NAD area; and
cooling the non-NAD area and the NAD area independently of one another if a limit temperature is exceeded.

16. The method of claim 15, wherein, if the limit temperature is exceeded, the non-NAD area is cooled by a forced airflow of a fan and/or the NAD area is cooled by a Peltier element and/or the force airflow.

17. The method of claim 16, wherein a heat of the non-NAD area is transported out of the antenna module by the forced airflow in a transverse direction along which the antenna module extends, a heat of the Peltier element is transported out of the antenna module by the forced airflow in the transverse direction, and/or the heat of the Peltier element is dissipated to a body of a vehicle to which the antenna module is mounted.

18. The method of claim 15, wherein the limit temperature is measured at the telematics printed circuit board, in the telematics printed circuit board, outside on the non-NAD area, inside in the non-NAD area, outside on the NAD area, and/or inside in the NAD area, and a component of the antenna module is not operated if the limit temperature is exceeded.

* * * * *